United States Patent
Aberl et al.

(10) Patent No.: US 10,388,392 B2
(45) Date of Patent: Aug. 20, 2019

(54) SAFE EXECUTION IN PLACE (XIP) FROM FLASH MEMORY

(71) Applicant: Texas Instruments Incorporated, Dallas, TX (US)

(72) Inventors: Peter Aberl, Kranzberg (DE); Aishwarya Dubey, Plano, TX (US); Rajat Sagar, Plano, TX (US); Eldad Falik, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 41 days.

(21) Appl. No.: 15/482,729

(22) Filed: Apr. 8, 2017

(65) Prior Publication Data

US 2018/0293129 A1    Oct. 11, 2018

(51) Int. Cl.
*G06F 11/10*    (2006.01)
*G11C 16/34*    (2006.01)
*G11C 29/42*    (2006.01)

(52) U.S. Cl.
CPC ...... *G11C 16/3459* (2013.01); *G06F 11/1068* (2013.01); *G11C 29/42* (2013.01)

(58) Field of Classification Search
CPC .......................... G06F 11/1016; G11C 16/3459
See application file for complete search history.

(56) References Cited

U.S. PATENT DOCUMENTS

| | | | | |
|---|---|---|---|---|
| 6,145,069 A * | 11/2000 | Dye | ........................ | H03M 7/30 345/501 |
| 9,910,676 B1 * | 3/2018 | Sivaraman Nair | ... | G06F 9/4401 |
| 2003/0206442 A1 * | 11/2003 | Tang | .................... | G06F 12/0866 365/185.17 |
| 2008/0172523 A1 * | 7/2008 | Tanaka | .................. | G06F 1/3225 711/103 |
| 2009/0024899 A1 * | 1/2009 | Reid | .................... | G06F 11/1068 714/758 |
| 2010/0023800 A1 * | 1/2010 | Harari | ................. | G06F 11/1068 714/2 |
| 2010/0037002 A1 * | 2/2010 | Bennett | ................. | G06F 3/0607 711/103 |

(Continued)

OTHER PUBLICATIONS

"ECC Memory", Wikipedia, available at https://en.wikipedia.orgwiki/ECC_memory, on Mar. 8, 2017, pp. 1-7.

(Continued)

*Primary Examiner* — Kyle Vallecillo

(74) *Attorney, Agent, or Firm* — Ebby Abraham; Charles A. Brill; Frank D. Cimino

(57) ABSTRACT

A device is provided that includes a processor, a flash memory configured to store error correcting code (ECC) blocks for execution in place (XIP) processing by the processor, wherein an ECC block includes a data block and an ECC code for the data block, a flash interface controller coupled to the flash memory, and an error correcting code (ECC) engine coupled between the processor and the flash interface controller, wherein the ECC engine is configured to receive a read command for the flash memory from the processor, to translate a read address to an ECC block address, to read the ECC block at the ECC block address from the flash memory via the flash interface controller, and to verify the ECC code in the read ECC block.

20 Claims, 3 Drawing Sheets

(56) References Cited

U.S. PATENT DOCUMENTS

| | | |
|---|---|---|
| 2010/0251074 A1 | 9/2010 | Chu |
| 2013/0013851 A1 | 1/2013 | Chang |
| 2014/0015565 A1 | 1/2014 | Xia |
| 2014/0281820 A1* | 9/2014 | Alrod ................. G11C 16/3459 714/773 |
| 2015/0301890 A1 | 10/2015 | Marshall |

OTHER PUBLICATIONS

Priyanka P. Ankolekar, et al., "Multibit Error-Correction Methods for Latency-Constrained Flash Memory Systems" IEEE Transations on Device and Materials Reliability, vol. 10, No. 1, Mar. 2010, pp. 33-39.
International Search Report dated Oct. 4, 2018.

* cited by examiner

| ADDRESS | DATA TYPE |
|---|---|
| 0 | DATA |
| 31 | DATA |
| 32 | ECC |
| 33 | ECC |
| 34 | DATA |
| 65 | DATA |
| 66 | ECC |
| 67 | ECC |

SAFE EXECUTION IN PLACE (XIP) FROM FLASH MEMORY

BACKGROUND OF THE DISCLOSURE

Field of the Disclosure

Embodiments of the present disclosure generally relate to execution in place (XIP), and more specifically relate to XIP from flash memory.

Description of the Related Art

For cost and size constrained devices such as the systems-on-a-chip (SOCs) used in advanced driver assistance systems (ADAS), the ability to directly execute program code from non-volatile memory such as flash memory, commonly referred to as execute in place (XIP), may be important. Driver assistance systems are required to meet the functional safety specifications of International Standard 26262 (ISO 26262) titled "Road Vehicles—Functional Safety." Meeting these requirements may necessitate the inclusion of various protection mechanisms in the systems that detect, minimize or eliminate failures due to malfunction of components such as, for example, any processors, digital logic, and memory incorporated in the system. Current flash devices do not cost effectively provide the protection mechanisms needed to meet these requirements.

SUMMARY

Embodiments of the present disclosure relate to methods and apparatus for safe execution in place (XIP) from flash memory. In one aspect, a device is provided that includes a processor, a flash memory configured to store error correcting code (ECC) blocks for execution in place (XIP) processing by the processor, wherein an ECC block includes a data block and an ECC code for the data block, a flash interface controller coupled to the flash memory, and an error correcting code (ECC) engine coupled between the processor and the flash interface controller, wherein the ECC engine is configured to receive a read command for the flash memory from the processor, to translate a read address to an ECC block address, to read the ECC block at the ECC block address from the flash memory via the flash interface controller, and to verify the ECC code in the read ECC block.

In one aspect, a method for safe execution in place (XIP) processing from flash memory is provided that includes receiving a read command from a processor in an error correcting code (ECC) engine coupled between the processor and a flash interface controller coupled to the flash memory, translating a read address to an error correcting code (ECC) block address by the ECC engine, wherein an ECC block comprises a data block and an ECC code for the data block, reading, by the ECC engine, the ECC block at the ECC block address from the flash memory via the flash interface controller, and verifying, by the ECC engine, the ECC code in the read ECC block.

BRIEF DESCRIPTION OF THE DRAWINGS

Particular embodiments will now be described, by way of example only, and with reference to the accompanying drawings.

DETAILED DESCRIPTION OF EMBODIMENTS OF THE DISCLOSURE

Figure 1:
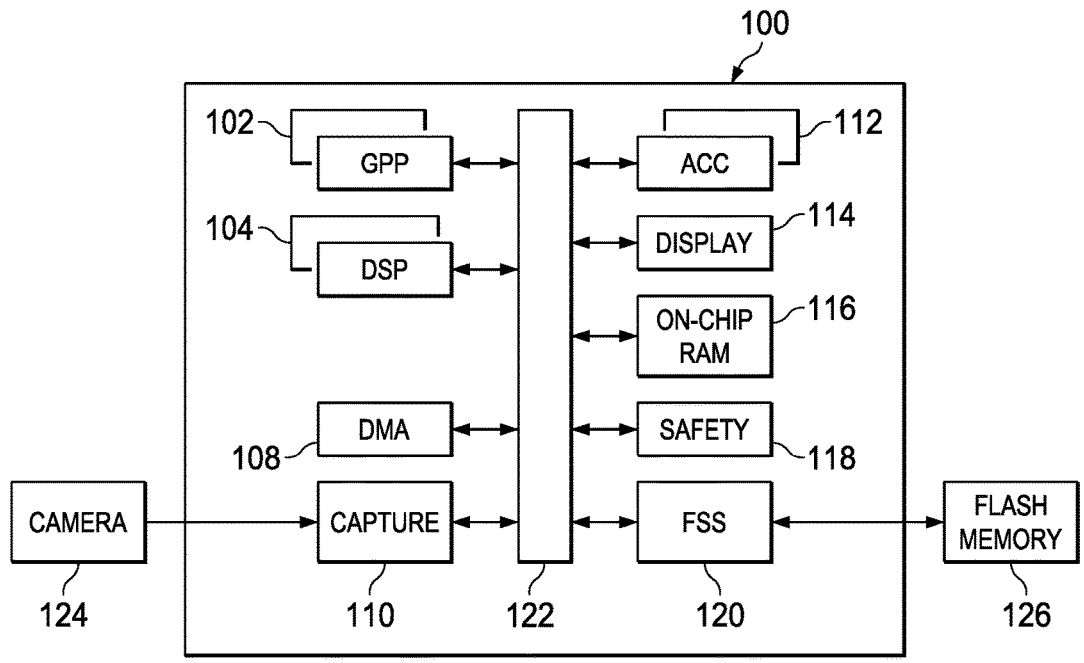
FIG. 1 is a high level block diagram of an example multiprocessor system-on-a-chip (SOC)

Specific embodiments of the disclosure will now be described in detail with reference to the accompanying figures. Like elements in the various figures are denoted by like reference numerals for consistency.

Execution in place (XIP) of program code stored in non-volatile memory such as flash memory is desirable for cost and size constrained devices such as the systems-on-a-chip (SOCs) used in advanced driver assistance systems (ADAS). Further, the functional safety requirements for use of embedded systems in automotive applications may necessitate the incorporation of protection mechanisms for various components of the system. Flash memory incorporated in such a system is one of the components that may need an effective protection mechanism. Soft errors, which change the value of one or more bits in a memory location, may occur. Soft errors may be caused by radiation or radioactive particles striking a memory cell causing the cell to change state, i.e., a '1' changes to a '0' or vice-versa. Transient errors introduced from noise sources such as cross talk or power/ground noises and bounces are also possible. Further, errors may be introduced by failures in the circuitry coupling flash memory to an SoC and circuit failures due to aging or temperature.

Embodiments of the disclosure provide for safe XIP from flash memory. More specifically, error correcting code (ECC) protection for accessing flash memory from an SoC is provided in some embodiments. The ECC protection is implemented on the SoC between any processors coupled to access the flash memory and a flash interface controller on the SoC, which provides protection from both soft errors in accessed flash memory locations and errors that may introduced due to failures in the circuitry coupling the flash memory to the SoC or failures in the flash interface controller. In some embodiments, regions of the flash memory covered by ECC protection are configurable. In some embodiments, the size of the data block on which the ECC is computed is configurable. In some embodiments, the ECC code for a data block is computed based on the data block contents and the ECC block address of the data block in the external flash memory.

FIG. 1 is a high level block diagram of an example multiprocessor system-on-a-chip (SOC) 100 configured to support safe execution in place (XIP) in a camera-based ADAS. The SOC 100 includes dual general purpose processors (GPP) 102, dual digital signal processors (DSP) 104, and hardware accelerators 112 coupled via a high speed interconnect 122. The hardware accelerators 112 may include, for example, a lens distortion correction accelerator, an image scaling accelerator, and/or a noise filter accelerator configured to perform various pre-processing operations on incoming camera images and a vector processor tuned for computer vision processing such as gradient computation, orientation binning, histogram normalization, etc. The GPP 102 hosts the operating system and provides overall control of the operation of the SOC 100 including scheduling of the preprocessing tasks performed by the hardware accelerators 112. The DSP 104 provides support for computer vision processing such as object detection and classification.

The SOC 100 further includes a direct memory access (DMA) component 108, a camera capture component 110 coupled to a camera 124, a display management component 114, and on-chip random access (RAM) memory 116, e.g., a computer readable medium, all coupled to the processors 102, 104 and the accelerators 112 via the interconnect 122. In addition, the SOC 100 includes a safety component 118 that includes safety related functionality to enable compliance with automotive safety requirements. Such functionality may include support for CRC (cyclic redundancy check) of data, clock comparator for drift detection, error signaling, windowed watch-dog timer, and self testing of the SOC for damage and failures.

The SOC 100 further includes a flash subsystem (FSS) 120 coupled to an external flash memory 126. The flash memory 126 may be any suitable flash memory. As is explained in more detail in reference to FIG. 2, the FSS 120 implements the interface between the processors and the flash memory 126 and includes functionality to provide for safe XIP from the flash memory 126. In some examples, all of the components of FSS 120 and/or SOC 100 may be included in and/or implemented on a single integrated circuit. In such examples, the single integrated circuit may be a first integrated circuit and flash memory 126 may be included in and/or implemented on a second integrated circuit different than the first integrated circuit.

Figure 2:
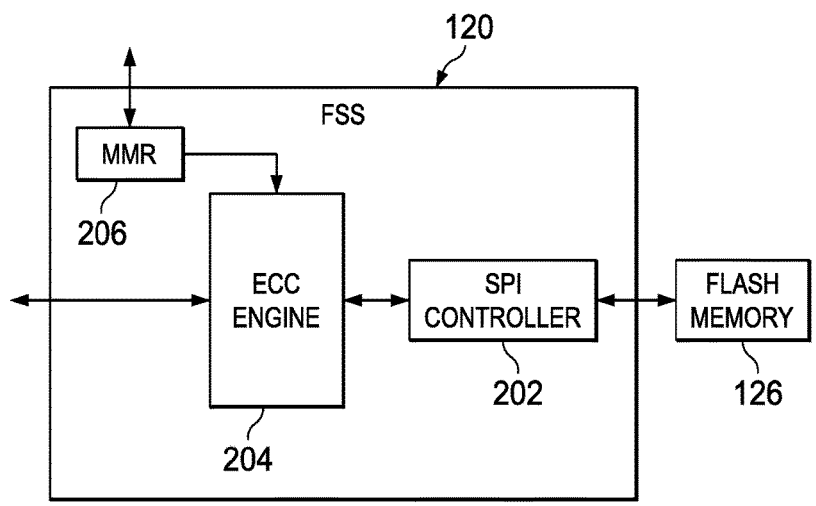
FIG. 2 is a simplified block diagram of the flash subsystem of the SOC of FIG. 1.

FIG. 2 is a simplified block diagram of the FSS 120 of FIG. 1. The FSS 120 includes a flash interface controller implemented as a serial peripheral interface (SPI) controller 202, an error correcting code (ECC) engine 204, and memory mapped registers (MMR) 206. The SPI controller 202 is the interface between the FSS 120 and the controller of the flash memory 126 and may be any suitable type of SPI, e.g., octal or quad SPI. In some examples, ECC engine 204 may be implemented on an integrated circuit and/or an integrated circuit package that is different than that of flash memory 126. In further examples, the flash memory 126 may be external to an SOC that includes FSS 120.

The ECC engine 204 provides for ECC of reads and writes to the flash memory 126 for XIP. The ECC engine 204 may implement both an ECC mode and a bypass mode in which no ECC is performed. Further, the ECC engine 204 provides ECC for specified regions of the flash memory 126 and no ECC for other regions. The ECC encoding used by the ECC engine 204 may be any suitable encoding, such as, for example a single error correction double error detection Hamming code.

Figures 3, 5:
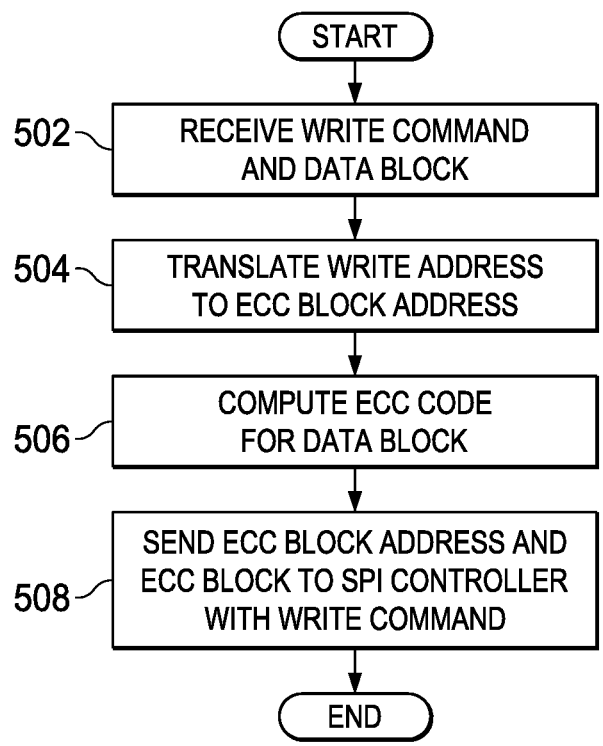
FIG. 3 is an example of storing error correcting code (ECC) blocks in the flash memory of the SOC of FIG. 1.
FIG. 5 is a flow diagram of a method for ECC write access to a flash memory.

The size of the data block read or written with ECC in the example of FIG. 2 is fixed. Any suitable block size may be used. The size of the block and the particular ECC encoding are used determine how many bits are needed to store the ECC code for the block. In some embodiments, the size of the data block is thirty-two bytes and two bytes are allocated for the ECC code, resulting in an ECC block of thirty-four bytes. The ECC blocks may be stored contiguously in the flash memory 126. FIG. 3 shows an example of storing two thirty-four byte ECC blocks. For simplicity of explanation, the operation of the ECC engine 204 for read and write accesses to the flash memory 126 is explained assuming an ECC block size of thirty-four bytes. One of ordinary skill in the art will understand embodiments in which other block sizes are used.

The ECC engine 204 expects write addresses to be aligned on a thirty-two byte boundary. For a write access to an ECC enabled region of the flash memory 126, the ECC engine 204 translates the write address to an ECC block address, determines the two byte ECC code for the thirty-two byte data block, and sends the write command, the ECC block address, the thirty-two byte data block, and the two byte ECC code to the SPI controller 202 for communication to the flash memory 126.

The ECC engine 204 is configured to handle read addresses aligned on a thirty-two byte boundary and non-aligned read addresses. Further, the ECC engine 204 is configured to handle a read request for data that is less than thirty-two bytes or spans multiple sequential thirty-two byte blocks. For an aligned read access to an ECC enabled region of the flash memory 126, the ECC engine 204 translates the read address to an ECC block address, determines the number of sequential ECC blocks to be read based on the amount of data requested, and sends the read command, the ECC block address, and the number of sequential blocks to be read to the SPI controller 202 for communication to the flash memory 126. When the ECC engine 204 receives the thirty-four byte ECC block(s) from the SPI controller 202, the ECC engine 204 determines the ECC code for the thirty-two byte data block of each received ECC block and compares the determined ECC code with the received ECC code. If an error is detected, the ECC engine 204 performs correction in the received data block if possible or signals an error if no correction is possible. If no error is detected or if an error is detected and corrected, the ECC engine 204 outputs the requested data.

For an unaligned read access to an ECC enabled region of the flash memory 126, the ECC engine 204 translates the unaligned read address to an aligned address of a thirty-two byte block containing the unaligned address and translates the aligned address to an ECC block address. The ECC engine also determines the number of ECC blocks to be read based on the amount of data requested. The ECC engine 204 then sends the read command, the ECC block address, and the number of sequential blocks to be read to the SPI controller 202 for communication to the flash memory 126. When the ECC engine 204 receives the thirty-four byte ECC block(s) from the SPI controller 202, the ECC engine 202 determines the ECC code for the thirty-two byte data block of each received ECC block and compares the determined ECC code with the received ECC code. If an error is detected, the ECC engine 204 performs correction in the received data block if possible or signals an error if no correction is possible. If no error is detected or if an error is detected and corrected, the ECC engine 204 outputs the requested data.

The address translation performed by the ECC engine 204 to translate an aligned read or write address to an ECC block address in the flash memory 126 may be computed as $$\text{Floor}(\text{Address}/\text{DataBlockSize}) \times \text{ECCBlockSize}$$

where Address is the requested read or write address, DataBlockSize is the size in bytes of the data block, e.g., thirty-two bytes, and ECCBlockSize is the size in bytes of the ECC block to be transferred to or from the flash memory 126.

The MMR 206 is configured to store various control and configuration parameters for ECC engine 204. The parameters may include a parameter to enable or disable ECC for all memory accesses and a start address and size for each of some number of ECC regions. The MMR 206 may also include various interrupt status registers and ECC error status registers.

Referring now to FIGS. 1 and 2, the FSS 120 may be used to configure the flash memory 126 for safe XIP. For example, the FSS 120 may be used to load instructions and data for XIP by one or more of the processors 102, 104 into ECC protected regions of the flash memory 126. For example, a software program may be executed on a GPP 102 to write the instructions and data into an ECC protected region via the FSS 120. As previously described, a write operation to an ECC protected region causes an ECC code to be attached to each thirty-two byte data block prior to storing in the flash memory 126.

One application of the safe XIP is booting a processor on the SOC 100 where at least some of the boot instructions and data are stored in an ECC region of the flash memory 126. For example, to boot a processor of the GPP 102, the processor may be powered up when the SOC 100 is powered up, during which initial boot instructions are executed from read-only memory (ROM) (not shown). At initial power up, ECC is not enabled in the FSS 120. Execution of the initial boot instructions from ROM then cause initial instructions of a secondary boot loader (SBL) to be executed from a non-ECC protection region of the flash memory 126. Execution of the initial SBL instructions causes the configuration of ECC parameters in the MMR 206 to specify the ECC region(s) in the flash memory 126 and to enable ECC. The execution of the SBL then moves to XIP of SBL instructions in an ECC enabled region of the flash memory 126.

Figure 4:
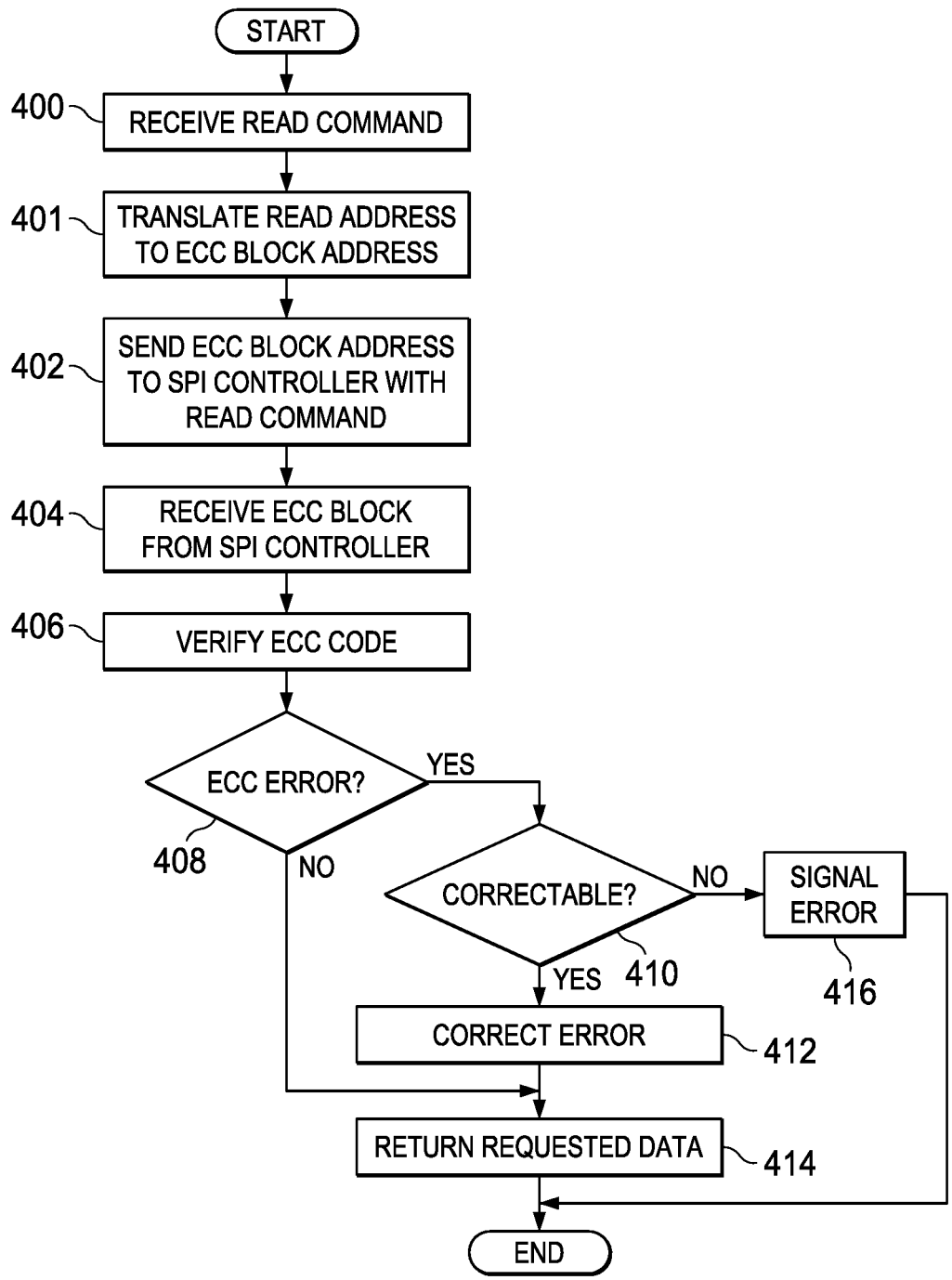
FIG. 4 is a flow diagram of a method for ECC protected read accesses of a flash memory in execute in place (XIP) mode.

FIG. 4 is a flow diagram of a method for ECC protected read accesses of a flash memory in XIP mode. For example purposes, the method is described in reference to the FSS 120 of FIG. 2 and assumes an ECC block size of thirty-four bytes. Further, the method assumes that ECC is enabled, the read access is to a region of the flash memory designated as an ECC region, and the read address is aligned.

As shown in FIG. 4, the ECC engine 204 receives 400 a read command and translates 401 the read address to an ECC block address. The ECC engine 204 then sends 402 the ECC block address to the SPI controller 202 with the read command. The ECC engine 204 receives 404 the requested ECC block from the SPI controller 202 and verifies 406 the ECC code of the received block to determine if an error has occurred. The ECC engine 204 verifies the ECC code by computing an ECC code for the received data block and comparing the computed ECC code to the received ECC code.

If there is no ECC error 408, the ECC engine 204 returns 414 the requested data block. If there is an ECC error 408 and the error is correctable 410, the ECC engine 204 corrects 412 the error and returns 414 the requested data block. Otherwise, the ECC engine 204 signals an error.

FIG. 5 is a flow diagram of a method for ECC write access to a flash memory. For example purposes, the method is described in reference to the FSS 120 of FIG. 2 and assumes an ECC block size of thirty-four bytes. Further, the method assumes that ECC is enabled, the write access is to a region of the flash memory designated as an ECC region, and the write address is aligned.

As shown in FIG. 5, the ECC engine 204 receives 502 a write command and a data block to be written and translates 504 the write address to an ECC block address. The ECC engine 204 also computes 506 an ECC code for the data block and appends the ECC code to the data block to create an ECC block. The ECC engine 204 then sends 508 the ECC block address and the ECC block to the SPI controller 202 with the write command.

Other Embodiments

While the disclosure has been described with respect to a limited number of embodiments, those skilled in the art, having benefit of this disclosure, will appreciate that other embodiments can be devised which do not depart from the scope of the disclosure as disclosed herein.

For example, embodiments have been described herein in which the size of an ECC block is fixed for all ECC regions of flash memory. One of ordinary skill in the art will understand embodiments in which the size of an ECC block is configurable by ECC region.

In another example, embodiments have been described herein in which an ECC engine is configured to perform ECC write operations to ECC regions. One of ordinary skill in the art will understand embodiments in which the ECC engine does not support ECC write operations. In such embodiments, ECC regions of the flash memory may be configured by an off-line program that loads ECC blocks in the flash memory in ECC regions.

In another example, embodiments have been described herein in which the flash memory may include both ECC regions and non-ECC regions. One of ordinary skill in the art will understand embodiments in which the entire flash memory is ECC protected. One of ordinary skill in the art will also understand embodiments in which ECC regions are not configurable but rather have fixed locations and sizes.

In another example, embodiments have been described herein in which the ECC code for a data block is placed at the end of an ECC block. One of ordinary skill in the art will understand embodiments in which the ECC code is placed in a different location, e.g., the beginning of the ECC block.

In another example, embodiments have been described herein in which the flash interface controller between the SOC 100 and the flash memory 126 is an SPI controller. One of ordinary skill in the art will understand that any suitable serial interface controller may be used, such as, for example, a hyperbus controller. Further, one of skill in the art will understand that any suitable parallel interface controller may be used when the flash memory is parallel flash memory such as, for example, NOR flash memory.

In another example, embodiments have been described herein in which the ECC code for a data block is computed using only the data in the data block. One of ordinary skill in the art will understand embodiments in which the ECC code is computed for both the data and the ECC block address. In such embodiments, when the ECC block is read, if an error is detected in the address portion of the ECC code, an error is signaled. Any error in the ECC block address may be indicative that the data block was read from the wrong address due to a transient error.

In another example, embodiments have been described here in which the flash memory is external to an SOC. One of ordinary skill in the art will understand embodiments for other device configurations, e.g., the flash memory may be part of the SOC.

In another example, one of ordinary skill in the art will understand embodiments in which the ECC engine signals a corrected error and the position of the corrected bit. Such information may be collected and used, for example, to detect long term effects such as drift or aging, or to detect systematic issues such as marginal timings.

In another example, one of ordinary skill in the art will understand embodiments in which the ECC engine is configured to inject errors in read and write commands for self test of ECC logic.

In another example, some embodiments have been described herein in the context of an embedded camera-based system in a vehicle. One of ordinary skill in the art will understand embodiments for other embedded systems, e.g., embedded radar systems. One of ordinary skill in the art will also understand embodiments for other applications, e.g., industrial applications, robotics, and drones.

Although method steps may be presented and described herein in a sequential fashion, one or more of the steps shown in the figures and described herein may be performed concurrently, may be combined, and/or may be performed in a different order than the order shown in the figures and/or described herein. Accordingly, embodiments should not be considered limited to the specific ordering of steps shown in the figures and/or described herein.

Certain terms are used throughout the description and the claims to refer to particular system components. As one skilled in the art will appreciate, components in systems may be referred to by different names and/or may be combined in ways not shown herein without departing from the described functionality. This document does not intend to distinguish between components that differ in name but not function. In the description and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection, for example.

It is therefore contemplated that the appended claims will cover any such modifications of the embodiments as fall within the true scope of the disclosure.

What is claimed is:

1. A device comprising:
    a processor;
    a flash memory configured to store error correcting code (ECC) blocks for execution in place (XIP) processing by the processor, wherein an ECC block comprises a data block and an ECC code for the data block;
    a flash interface controller coupled to the flash memory; and
    an error correcting code (ECC) engine coupled between the processor and the flash interface controller, wherein the ECC engine is configured to receive a read command for the flash memory from the processor, to translate a read address to an ECC block address, to read the ECC block at the ECC block address from the flash memory via the flash interface controller, and to verify the ECC code in the read ECC block.

2. The device of claim 1, wherein the flash interface controller is a serial peripheral interface (SPI) controller.

3. The device of claim 1, wherein the flash memory is parallel flash memory.

4. The device of claim 1, wherein the ECC engine is further configured to convert the read address to an aligned read address when the read address is unaligned.

5. The device of claim 1, wherein the ECC engine is configurable to define ECC regions of the flash memory.

6. The device of claim 5, wherein ECC block sizes are identical for all ECC regions.

7. The device of claim 5, wherein ECC block sizes are configurable for one or more ECC regions.

8. The device of claim 1, wherein computation of the ECC code for the data block includes the data block and the ECC block address and the ECC engine is further configured to signal an error if an error is detected in the ECC block address of the ECC code when the ECC code is verified.

9. The device of claim 1, wherein the ECC engine is further configured to receive a write command for the flash memory from the processor, to translate a write address to a second ECC block address, to generate a second ECC code for a second data block to be written to the flash memory, and to write a second ECC block comprising the second data block and the second ECC code to the flash memory at the second ECC block address via the flash interface controller.

10. The device of claim 1, wherein the processor, the flash interface controller, and the ECC engine are comprised in a system-on-a-chip (SOC) and the flash memory is external to the SOC.

11. A method for safe execution in place (XIP) processing from flash memory, the method comprising:
    receiving a read command from a processor in an error correcting code (ECC) engine coupled between the processor and a flash interface controller coupled to the flash memory;
    translating a read address to an error correcting code (ECC) block address by the ECC engine, wherein an ECC block comprises a data block and an ECC code for the data block;
    reading, by the ECC engine, the ECC block at the ECC block address from the flash memory via the flash interface controller; and
    verifying, by the ECC engine, the ECC code in the read ECC block.

12. The method of claim 11, wherein the flash interface controller is a serial peripheral interface (SPI) controller.

13. The method of claim 11, wherein the flash memory is parallel flash memory.

14. The method of claim 11, further comprising converting the read address to an aligned read address when the read address is unaligned.

15. The method of claim 11, wherein the ECC engine is configurable to define ECC regions of the flash memory.

16. The method of claim 15, wherein ECC block sizes are identical for all ECC regions.

17. The method of claim 12, wherein ECC block sizes configurable for one or more ECC regions.

18. The method of claim 11, wherein the ECC code was computed for the data block and the ECC block address and the method further comprises signaling an error by the ECC engine if an error is detected in the ECC block address of the ECC code when the ECC code is verified.

19. The method of claim 11, wherein the method further comprises:
    receiving, by the ECC engine, a write command for the flash memory from the processor;
    translating a write address to a second ECC block address by the ECC engine;
    generating, by the ECC engine, a second ECC code for a second data block to be written to the flash memory; and
    writing, by the ECC engine, a second ECC block comprising the second data block and the second ECC code to the flash memory at the second ECC block address via the flash interface controller.

20. The method of claim 11, wherein the processor, the flash interface controller, and the ECC engine are comprised in a system-on-a-chip (SOC) and the flash memory is external to the SOC.

* * * * *